United States Patent
Dapper et al.

[19]

[11] Patent Number: 5,809,065
[45] Date of Patent: Sep. 15, 1998

[54] METHOD AND APPARATUS FOR IMPROVING THE QUALITY OF AM COMPATIBLE DIGITAL BROADCAST SYSTEM SIGNALS IN THE PRESENCE OF DISTORTION

[75] Inventors: Mark J. Dapper, Cincinnati; Barry W. Carlin, Greenhills; Michael J. Geile, Loveland, all of Ohio

[73] Assignee: USA Digital Radio Partners, L.P., New York, N.Y.

[21] Appl. No.: 603,768

[22] Filed: Feb. 20, 1996

[51] Int. Cl.$^6$ .............................. H04L 25/00; H04L 27/00
[52] U.S. Cl. ...................... 375/216; 455/553; 455/135; 329/347
[58] Field of Search ...................... 375/216, 217, 375/320, 346; 455/74, 132, 133, 134, 135, 142, 143, 553; 329/347, 349, 363

[56] References Cited

U.S. PATENT DOCUMENTS

| | | | |
|---|---|---|---|
| 3,160,812 | 12/1964 | Scantlin | 325/30 |
| 3,714,375 | 1/1973 | Stover | 179/2 |
| 4,323,731 | 4/1982 | Hershberger | 179/2 |
| 4,379,947 | 4/1983 | Warner | 179/2 |
| 4,512,013 | 4/1985 | Nash et al. | 370/69 |
| 4,550,415 | 10/1985 | Debus, Jr. et al. | 375/14 |
| 4,843,583 | 6/1989 | White et al. | 354/724 |
| 4,847,797 | 7/1989 | Picchi et al. | 364/602 |
| 4,943,974 | 7/1990 | Motamedi | 375/200 |
| 5,006,926 | 4/1991 | Tsinberg | 358/12 |
| 5,113,142 | 5/1992 | Yoshikawa | 329/306 |
| 5,146,612 | 9/1992 | Grosjean et al. | 455/45 |
| 5,175,747 | 12/1992 | Murakami | 375/14 |
| 5,191,576 | 3/1993 | Pommier et al. | 370/18 |
| 5,214,671 | 5/1993 | Nakai | 375/14 |
| 5,243,624 | 9/1993 | Paik et al. | 375/14 |
| 5,268,930 | 12/1993 | Sendyk et al. | 375/13 |
| 5,351,148 | 9/1994 | Maeda et al. | 359/124 |
| 5,416,802 | 5/1995 | Ishii | 375/216 |
| 5,418,815 | 5/1995 | Ishikawa et al. | 375/216 |
| 5,448,590 | 9/1995 | Kostic | 375/232 |
| 5,533,055 | 7/1996 | Matzek | 375/286 |
| 5,598,430 | 1/1997 | Hachisuka et al. | 375/216 |

*Primary Examiner*—Don N. Vo

[57] ABSTRACT

A system and method are provided for reducing perceived distortion in an output audio signal derived from an amplitude modulated compatible digital broadcast signal having an analog portion and a digital portion. The digital portion of this signal is demodulated to produce a demodulated digital signal and the analog portion of the signal is demodulated to produce a demodulated analog signal. The noise in the demodulated digital signal is measured and an estimate of the signal-to-noise ratio is derived. This estimated signal-to-noise ratio is compared with a threshold level which is set at the minimum acceptable signal quality for the digital signal. Based upon the estimated signal-to-noise ratio, a switch directs either the analog derived audio output or the digitally derived audio output as the system output signal.

16 Claims, 1 Drawing Sheet

METHOD AND APPARATUS FOR IMPROVING THE QUALITY OF AM COMPATIBLE DIGITAL BROADCAST SYSTEM SIGNALS IN THE PRESENCE OF DISTORTION

BACKGROUND OF THE INVENTION

1. Field Of The Invention

This invention relates to radio broadcasting and, more particularly, to methods of and apparatus for improving the quality of an amplitude modulated compatible digital broadcast signal in the presence of distortion.

2. Description Of Related Art

There has been increasing interest in the possibility of broadcasting digitally encoded audio signals to provide improved audio fidelity. Several approaches have been suggested. One such approach, set forth in U.S. Pat. No. 5,588,022 teaches a method for simultaneously broadcasting analog and digital signals in a standard AM broadcasting channel. An amplitude modulated radio frequency signal having a first frequency spectrum is broadcast. The amplitude modulated radio frequency signal includes a first carrier modulated by an analog program signal. Simultaneously, a plurality of digitally modulated carrier signals are broadcast within a bandwidth which encompasses the first frequency spectrum. Each of the digitally modulated carrier signals is modulated by a portion of a digital program signal. A first group of the digitally modulated carrier signals lies within the first frequency spectrum and is modulated in quadrature with the first carrier signal. Second and third groups of the digitally modulated carrier signals lie outside of the first frequency spectrum and are modulated both in-phase and in-quadrature with the first carrier signal. Both transmitters and receivers are provided in accordance with that method.

The waveform in the AM compatible digital audio broadcasting system described in U.S. Pat. No. 5,588,022, hereby incorporated herein by reference, has been formulated to provide optimal data throughput for the digital signal while avoiding cross talk into the analog AM channel. In such an AM compatible digital audio broadcasting system, the program material is broadcast in both analog and digital form. Generally, the analog form of the program material is relatively more tolerant of noise and interference. This tolerance is attributed to the inherent characteristics of the analog and digital waveforms and the broadcasting of the digital information at a lower level than the analog information. This latter situation is illustrated in FIG. 1.

U.S. Pat. No. 5,142,551 discloses a signal weighting system for a digital receiver in which a confidence level is associated with portions of a communication signal transmitted upon a multipath channel. A signal received by the receiver is equalized by an equalizer circuit such as a maximum likelihood sequence estimator. An equalized signal is generated which is then supplied to an adaptive filter which synthesizes portions of the multipath channel. The signal received by the receiver is altered responsive to values of a filtered, equalized signal generated by the adaptive filter. However, no method has been disclosed for reducing distortion in an AM compatible digital audio broadcasting system. As a result, there is a need for a method and apparatus for reducing perceived distortion in an AM compatible digital audio broadcasting system.

SUMMARY OF THE INVENTION

A system for reducing perceived distortion in an output audio signal derived from an amplitude modulated compatible digital broadcast signal is provided. The digital broadcast signal has an analog portion and a digital portion. The system includes means for demodulating the digital portion of the signal to produce a demodulated digital signal. Likewise, the system includes means for demodulating the analog portion of the signal to produce a demodulated analog signal. The system measures the noise in the demodulated digital signal and compares the noise to a threshold level set at a minimum acceptable signal quality. A switching means is provided in the system to select either the demodulated digital signal or the demodulated analog signal as the output audio signal. The switch will send as the output audio signal the demodulated digital signal as long as the noise in the demodulated digital signal is at or better than the threshold level for minimum acceptable signal quality.

BRIEF DESCRIPTION OF THE DRAWINGS

The invention will be more readily apparent to those skilled in the art by reference to the accompanying drawings wherein.

DETAILED DESCRIPTION OF THE PREFERRED EMBODIMENTS

Figure 1:
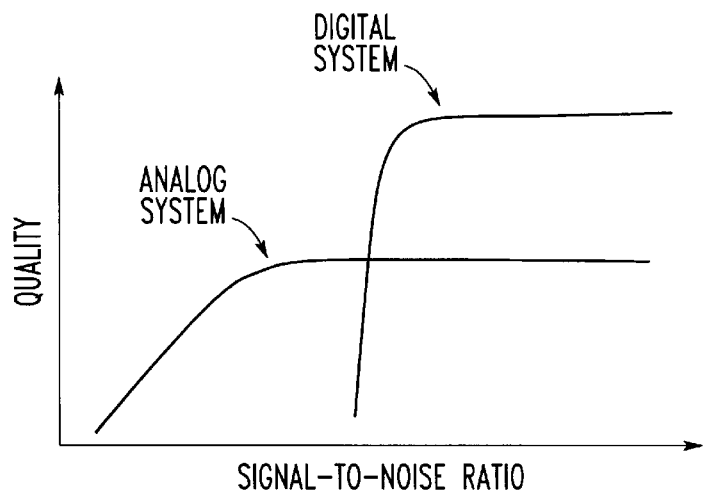
FIG. 1 is a graph showing the relative signal tolerance to signal-to-noise ratio degradation for an analog system and a digital system.
Figure 2:
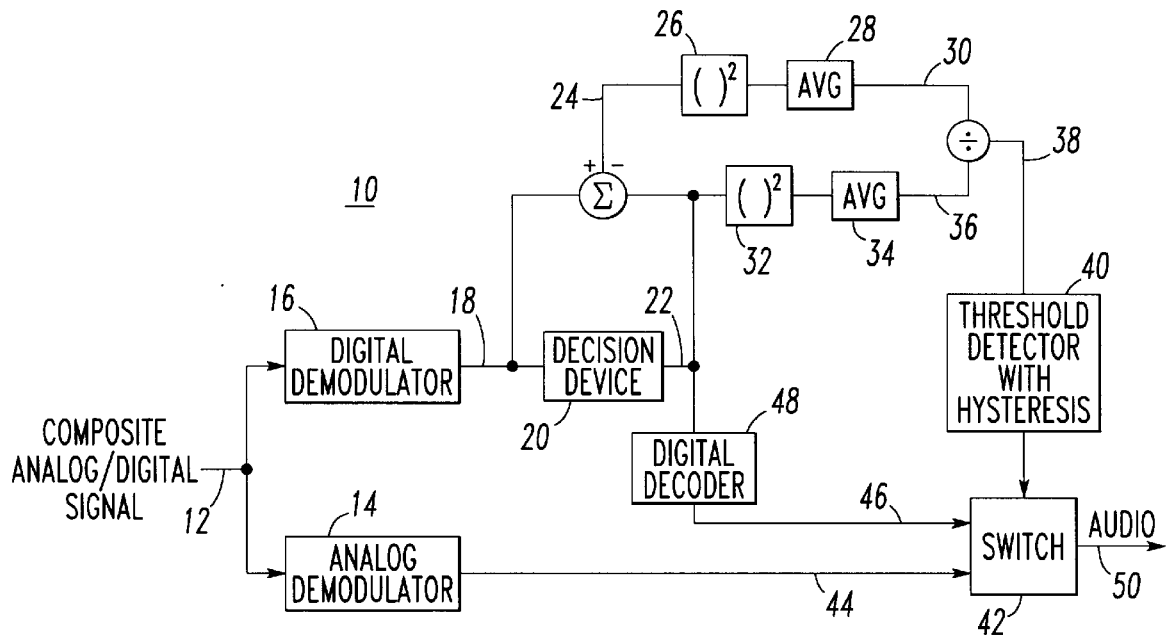
FIG. 2 is a block diagram of a presently preferred embodiment of the apparatus for improving the quality of AM compatible digital broadcast signals of the present invention.

The system 10 of the present invention is illustrated in FIG. 2. Therein, a composite analog and digital waveform signal 12 is applied to analog demodulator 14 and digital demodulator 16. Although in one particular implementation the digital and analog signals are co-channel, this is not a prerequisite for the system 10 to operate.

Digital demodulator 16 produces samples of the digital symbols 18 which are corrupted by noise or interference. The noisy symbols 18 are applied to a decision device 20 which estimates the transmitted data symbol sequence by examining the noisy input symbols 18 from the demodulator 16. In the presently preferred embodiment of system 10, this decision is based upon minimum Euclidean distance. However, other metrics, such as Hamming distance in a coded system, are possible.

The output 22 of decision device 20 consists of a sequence of data symbols which are subtracted from the noisy input samples 18 to decision device 20 to produce an error estimate 24. This error estimate 24 is squared in operation 26 to remove the error polarity information. After squaring, the error sequence is filtered or averaged in operation 28. This filtered error sequence is now proportional to the variance of the noisy data samples 18. By definition, this renders the noise or interference power 30.

Similarly, the output 22 of decision device 20 is squared in operation 32 and again averaged or filtered in operation 34. This sequence is then proportional to the mean square value of the data signal 18.

By definition, this renders the signal power 36. Using the signal power 36 and noise power 30, an estimate of the per channel signal-to-noise ratio 38 can be produced by computing the ratio of the mean squared symbol estimate 36 to the variance of the error sequence 30. For symbol error rates of interest (below 10%), there is little loss in accuracy due to symbol errors.

The squaring, averaging, and ratio operations discussed above can be replaced by other operations which also yield a monotonic variation in some quantity as a function of the mean variance of the symbol samples. As an example, the squaring operation can be replaced by an absolute value operation.

The estimated signal-to-noise ratio 38 is applied to a threshold detector 40 which is set to operate at the boundary between the region in which the demodulated symbols support acceptable digital audio quality and the region in which the error rate is too large to support acceptable quality. The threshold detector 40 incorporates hysteresis so that the decision does not oscillate rapidly when the detected signal-to-noise ratio 38 is close to the threshold setting.

The threshold detector 40 is used to control a switch 42 which selects either the analog derived audio output 44 or the digitally derived audio output 46 in accordance with the digital signal quality estimate 38. A digital decoder 48 is used to convert the demodulated digital symbols 18 to digitally derived audio output 46. Switch 42 ultimately transmits audio signal 50 which is either analog derived audio output signal 44 or digitally derived audio output signal 46.

If desired, a gradual transition from analog to digital conditions can be effected by replacing the threshold detector 40 and switch 42 with a circuit or computation which changes the relative ratio of output source as a function of the computed signal-to-noise ratio 38. Such a circuit or computation is selected from those well known by those skilled in the art.

In the foregoing specification certain preferred practices and embodiments of this invention have been set out, however, it will be understood that the invention may be otherwise embodied within the scope of the following claims.

We claim:

1. A system for reducing perceived distortion in an output audio signal derived from an amplitude modulated compatible digital broadcast signal having an analog portion and a digital portion, said system comprising:
   (a) means for demodulating said digital portion of said signal to produce a demodulated digital signal having a signal-to-noise ratio;
   (b) means for demodulating said analog portion of said signal to produce a demodulated analog signal;
   (c) means for estimating the signal-to-noise ratio in the demodulated digital signal;
   (d) means for comparing the estimated signal-to-noise ratio in the demodulated digital signal to a threshold level set at the minimum acceptable signal quality; and
   (e) means responsive to said means for comparing for switching said output audio signal between said demodulated digital signal and said demodulated analog signal.

2. The system of claim 1 wherein said means for estimating the signal-to-noise ratio in the demodulated digital signal comprises means for estimating the noise in the demodulated digital signal, means for estimating the power of the demodulated digital signal, and means for dividing the estimated noise in the demodulated digital signal into the estimated power of the demodulated digital signal.

3. The system of claim 2 wherein said means for estimating the noise in the demodulated digital signal comprises means for subtracting the demodulated digital signal from said digital signal to obtain an error estimate, means for squaring said error estimate, and means for averaging said squared error estimate.

4. The system of claim 3 wherein said means for estimating the power of the demodulated digital signal comprises means for squaring the demodulated digital signal and means for averaging said squared signal.

5. The system of claim 2 wherein said means for estimating the power of the demodulated digital signal comprises means for squaring the demodulated digital signal and means for averaging said squared signal.

6. The system of claim 1 wherein said means for estimating the signal-to-noise ratio in the demodulated digital signal detects a monotonic variation in a quantity of said demodulated digital signal as a function of the mean and variance of said quantity.

7. The system of claim 1 wherein said means for switching said output audio signal between said demodulated digital signal and said demodulated analog signal operates with hysteresis.

8. The system of claim 1 wherein said means for switching said output audio signal between said demodulated digital signal and said demodulated analog signal includes means for combining relative portions of said demodulated digital signal and said demodulated analog signal in response to said means for comparing.

9. A method for reducing perceived distortion in an output audio signal derived from an amplitude modulated compatible digital broadcast signal having an analog portion and a digital portion, said method comprising the steps of:
   (a) demodulating said digital portion of said signal to produce a demodulated digital signal;
   (b) demodulating said analog portion of said signal to produce a demodulated analog signal;
   (c) estimating the signal-to-noise ratio in the demodulated digital signal;
   (d) comparing the estimated signal-to-noise ratio in the demodulated digital signal to a threshold level set at the minimum acceptable signal quality; and
   (e) switching said output audio signal between said demodulated digital signal and said demodulated analog signal in response to the comparison between the estimated signal-to-noise ratio in the demodulated digital signal and the threshold level.

10. The method of claim 9 wherein the step of estimating said signal-to-noise ratio in the demodulated digital signal comprises the steps of estimating the noise in the demodulated digital signal, estimating the power of the demodulated digital signal, and dividing the estimated noise in the demodulated digital signal into the estimated power of the demodulated digital signal.

11. The method of claim 10 wherein the step of estimating the noise in the demodulated digital signal comprises the steps of subtracting the demodulated digital signal from said digital signal to obtain an error estimate, squaring said error estimate, and averaging said squared error estimate.

12. The method of claim 11 wherein the step of estimating the power of the demodulated digital signal comprises the steps of squaring the demodulated digital signal and averaging said squared signal.

13. The method of claim 10 wherein the step of estimating the power of the demodulated digital signal comprises the steps of squaring the demodulated digital signal and averaging said squared signal.

14. The method of claim 9 wherein the step of estimating the signal-to-noise ratio in the demodulated digital signal detects a monotonic variation in a quantity of said demodulated digital signal as a function of the mean and variance of said quantity.

15. The method of claim 9 wherein the step of switching said output audio signal between said demodulated digital signal and said demodulated analog signal operates with hysteresis.

16. The method of claim 9 wherein the step of switching said output audio signal between said demodulated digital signal and said demodulated analog signal includes the step of combining relative portions of said demodulated digital signal and said demodulated analog signal in response to the comparison between the estimated signal-to-noise ratio in the demodulated digital signal and the threshold level.

\* \* \* \* \*